(12) United States Patent
Siefering

(10) Patent No.: US 9,490,138 B2
(45) Date of Patent: Nov. 8, 2016

(54) METHOD OF SUBSTRATE TEMPERATURE CONTROL DURING HIGH TEMPERATURE WET PROCESSING

(71) Applicant: TEL FSI, Inc., Chaska, MN (US)

(72) Inventor: Kevin L. Siefering, Excelsior, MN (US)

(73) Assignee: TEL FSI, INC., Chaska, MN (US)

( * ) Notice: Subject to any disclaimer, the term of this patent is extended or adjusted under 35 U.S.C. 154(b) by 0 days.

(21) Appl. No.: 14/565,542

(22) Filed: Dec. 10, 2014

(65) Prior Publication Data

US 2015/0162211 A1 Jun. 11, 2015

Related U.S. Application Data

(60) Provisional application No. 61/914,120, filed on Dec. 10, 2013.

(51) Int. Cl.
*H01L 21/311* (2006.01)
*H01L 21/67* (2006.01)

(52) U.S. Cl.
CPC .... *H01L 21/31111* (2013.01); *H01L 21/67109* (2013.01); *H01L 21/6708* (2013.01)

(58) Field of Classification Search
None
See application file for complete search history.

(56) References Cited

U.S. PATENT DOCUMENTS

| 5,904,546 | A | * | 5/1999 | Wood | H01L 21/78 257/E21.599 |
| 6,087,273 | A | * | 7/2000 | Torek | H01L 21/31111 216/99 |
| 6,096,233 | A | | 8/2000 | Taniyama et al. | |
| 6,197,150 | B1 | | 3/2001 | Kwag et al. | |
| 6,443,168 | B1 | | 9/2002 | Morita et al. | |
| 6,467,297 | B1 | | 10/2002 | Bollinger et al. | |
| 7,225,819 | B2 | | 6/2007 | Jackson | |
| 7,338,910 | B2 | * | 3/2008 | Lee | H01L 21/28518 257/E21.165 |
| 7,416,632 | B2 | | 8/2008 | Orii et al. | |
| 8,716,146 | B2 | * | 5/2014 | Nowling | H01L 21/31111 216/106 |
| 2005/0160990 | A1 | | 7/2005 | Lubomirsky | |
| 2008/0087645 | A1 | * | 4/2008 | Izuta | C09K 13/04 216/93 |
| 2009/0020503 | A1 | * | 1/2009 | Kim | C03C 15/00 216/23 |
| 2013/0029495 | A1 | * | 1/2013 | Adhiprakasha | H01L 21/31111 438/757 |
| 2013/0078809 | A1 | * | 3/2013 | Yu | H01L 21/6708 438/689 |
| 2015/0140690 | A1 | * | 5/2015 | Sakai | H01L 27/14687 438/5 |

* cited by examiner

*Primary Examiner* — Anita Alanko
(74) *Attorney, Agent, or Firm* — Kagan Binder, PLLC

(57) ABSTRACT

Methods are provided for processing a substrate in single substrate tool. In one embodiment, the method includes providing the substrate in the single substrate tool, applying a first processing fluid at a first temperature greater than 100° C. to a lower surface of the substrate to heat the substrate to approximately the first temperature, and applying a second processing fluid at a second temperature greater than 100° C. to an upper surface of the substrate.

19 Claims, 2 Drawing Sheets

METHOD OF SUBSTRATE TEMPERATURE CONTROL DURING HIGH TEMPERATURE WET PROCESSING

CROSS-REFERENCE TO RELATED APPLICATIONS

Pursuant to 37 CFR §1.78(a)(4), this application claims the benefit of and priority to U.S. Provisional Application Ser. No. 61/914,120, filed on Dec. 10, 2013, the entire content of which is herein incorporated by reference.

FIELD OF INVENTION

The present invention relates to the field of processing substrates, and more particularly to a method of wet processing a substrate at high temperature.

BACKGROUND OF THE INVENTION

In a single substrate processing tool, when a hot etching solution is dispensed onto a cold substrate, such as a semiconductor wafer, the etch rate of the substrate or a film on the substrate is initially low but gradually increases as the surface of the substrate is heated by the hot etching solution. This time variation in the etch rate is undesirable for several reasons. Firstly, since the hot etching solution is often dispensed near the center of a spinning substrate, the substrate surface is not heated uniformly in a radial direction. This results in a radial variation in the etch rate across the substrate surface, and thus radial variation in the overall amount of material that is etched from the substrate. Secondly, the etching solution is often an expensive high purity chemical (e.g., phosphoric acid), and since the etch rate during the initial heat-up period is low, a significant portion of the etching solution that is dispensed during the heat-up period is effectively wasted, and it performs less etching the etching solution that is dispensed after the substrate surface has reached the desired temperature.

Several ideas have been proposed in order to solve these problems. In one example, hot sulfuric acid is dispensed to the upper surface of the substrate in order to heat up the substrate before etching with phosphoric acid. The sulfuric acid may be atomized using steam to further increase the heating effect. Sulfuric acid can be heated to very high temperatures (about 200° C.), and it is significantly less expensive than phosphoric acid. The sulfuric acid can also potentially be reclaimed and reused to reduce the chemical cost. However, a problem with this method is that sulfuric acid cannot be used if the upper surface of the substrate has exposed films (e.g., SiGe films) that are etched or damaged by the sulfuric acid.

In another example, hot water is dispensed to the upper surface of the substrate. The hot water is commonly compatible with materials that are exposed on the upper surface on the substrate (e.g., SiGe), but the use of hot water but limits the pre-heating of the substrate to a temperature of about 90° C. If steam is used simultaneously with the hot water, a substrate temperature approaching 100° C. may be reached. However, a substrate temperature approaching 100° C. is still far short of what is needed for many important wet etching processes, such as silicon nitride etching using phosphoric acid. An attempt to use hot water and/or steam to pre-heat the substrate prior to dispensing a hot phosphoric etching solution would result in unacceptable radial non-uniformity, wasting of the etching solution, and long processing times.

Accordingly, new methods are required to address these and other problems encountered in high-temperature wet processing in single wafer tools.

SUMMARY OF THE INVENTION

Methods are provided for processing a substrate with a hot processing fluid in single substrate tool. In one example, the substrate is pre-heated to a first temperature greater than 100° C. with high radial temperature uniformity across the substrate prior to silicon nitride etching. Good radial temperature uniformity is achieved that is difficult or not possible using conventional methods. Embodiments of the invention provide the ability to pre-heat the substrate to a desired temperature and temperature uniformity without applying a processing fluid to the upper (front) surface of the substrate.

In one embodiment, the method includes providing the substrate in the single substrate tool, applying a first processing fluid at a first temperature greater than 100° C. to a lower surface of the substrate to heat the substrate to approximately the first temperature, and applying a second processing fluid at a second temperature greater than 100° C. to an upper surface of the substrate.

In another embodiment, the method includes applying a first processing fluid containing phosphoric acid at a first temperature greater than 100° C. to a lower surface of the substrate to heat the substrate to approximately the first temperature, and applying a second processing fluid containing phosphoric acid at a second temperature greater than 100° C. to an upper surface of the substrate, wherein applying the second processing fluid etches a nitride film on the upper surface of the substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF SEVERAL EMBODIMENTS

Embodiments of the invention address the above-described problems encountered in wet processing a substrate in single substrate tools. The substrate can, for example, be a circular semiconductor wafer (e.g., Si, GaAs, Ge, SiGe) with a diameter of 200 mm, 300 mm, 450 mm, or larger than 450 mm.

In one processing example, hot (e.g., 165° C. or higher) phosphoric acid may be used to etch a nitride film on a substrate. The nitride film can include a silicon nitride film on the upper surface of the substrate, where the upper surface includes active components of a semiconductor device. The hot phosphoric acid effectively etches the silicon nitride film when the substrate temperature reaches the temperature of the hot phosphoric acid. Due to tight tolerances that are required in the radial etch uniformity, it is critical that the substrate be uniformly heated in the radial direction during the entire silicon nitride etching process.

Figure 1:
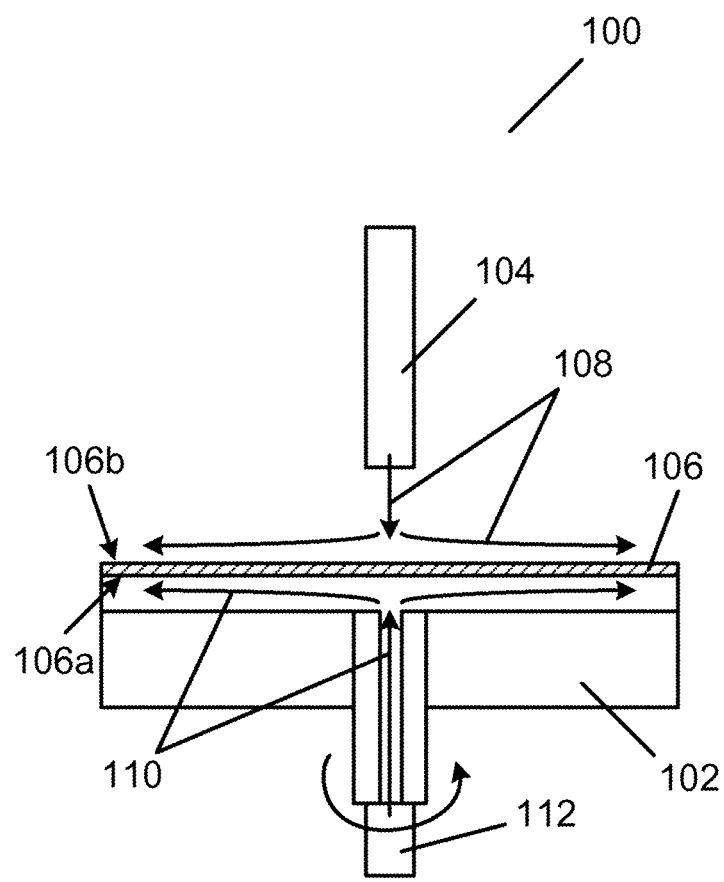
FIG. 1 schematically shows a cross-sectional view of a single substrate tool for wet processing a substrate according to an embodiment of the invention.
Figure 2:
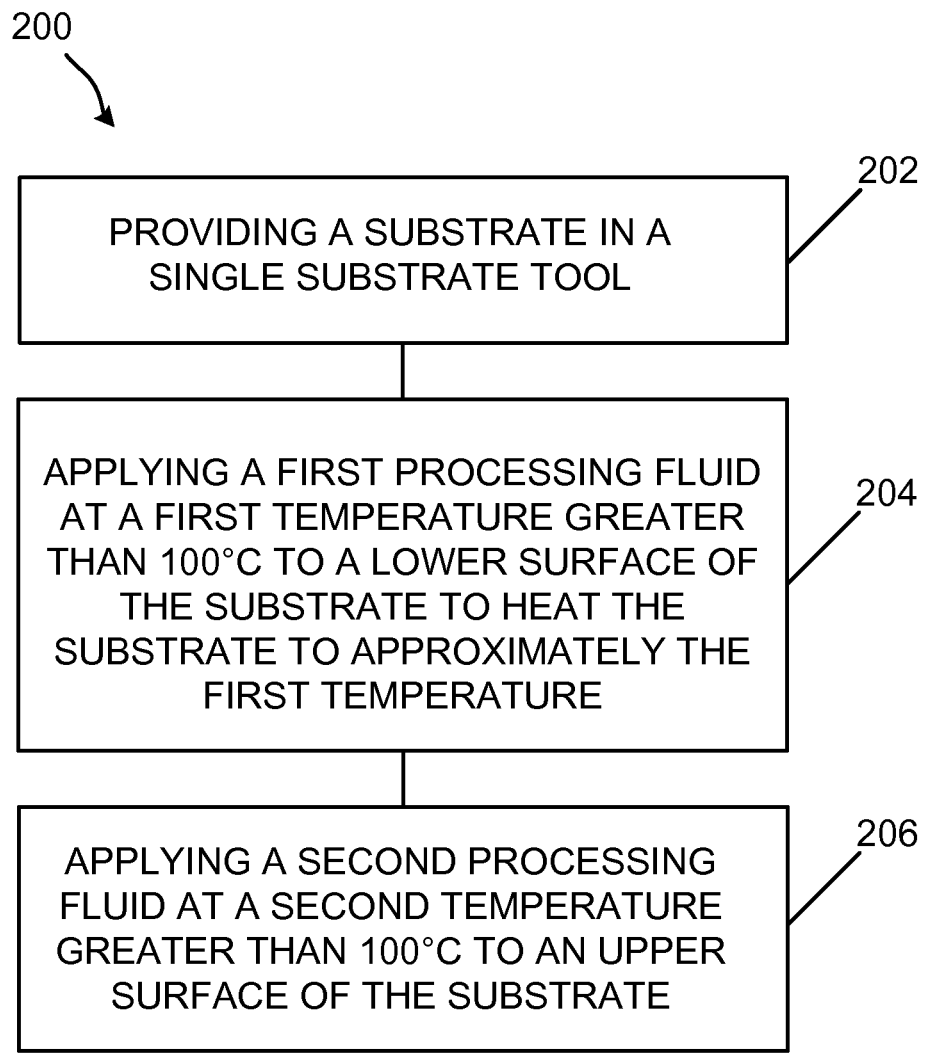
FIG. 2 is a process flow diagram for processing a substrate in single substrate tool according to an embodiment of the invention.

Referring now to FIGS. 1 and 2, according to one embodiment of the invention, a process 200 for processing a substrate 106 in single substrate tool 100 is described. The method includes in 202, providing the substrate 106 in the single substrate tool 100, in 204, applying a first processing fluid 110 at a first temperature greater than 100° C. from a first fluid delivery system 112 to a lower surface 106a of the substrate 106 to heat the substrate 106 to approximately the first temperature and, in 206, applying a second processing fluid 108 from a second fluid delivery system 104 at a second temperature greater than 100° C. to an upper surface 106b of the substrate 106. In some examples the first and second temperatures can be greater than 130° C., or greater than 16020 C. The substrate 106 is supported by substrate holder 112 that may be rotated during substrate processing.

Applying a first processing fluid at a first temperature greater than 100° C. to a lower surface of the substrate results in pre-heating the entire substrate by conduction of heat through the substrate from the lower surface of the substrate to the upper surface of the substrate. This pre-heating can be done without exposing the upper surface of the substrate to the second processing fluid until the desired temperature for the upper surface of the substrate has been reached. In one example, this requires the single substrate tool to have capability to flow a very hot first processing fluid up through a back side dispense nozzle onto the lower surface of the substrate as well as a substrate holder (chuck) and baffle system that can contain the dispensed first processing fluid and prevent droplets of the first processing fluid from splashing of the baffle and reaching the upper surface of the substrate.

Following the pre-heating of the substrate to the first temperature, the method includes applying a second processing fluid at a second temperature greater than 100° C. to an upper surface of the substrate. In one example, the application of first processing fluid may be stopped when the application of the second processing fluid is initiated. In another example, the application of first processing fluid may be continuously applied, including when the application of the second processing fluid is performed. Thus, applying the first processing fluid to the lower surface of the substrate may overlap in time with applying the second processing fluid to the upper surface of the substrate.

EXAMPLES

In a first embodiment, the first and second processing fluids can contain the same chemical. In this example, the same chemical is used to pre-heat the lower surface of the substrate and, subsequently, treat the upper surface of the substrate. The chemical can include one or more acids, such as phosphoric acid, sulfuric acid, or a mixture of phosphoric acid and sulfuric acid. However, other processing fluids may be used. The use of the same chemical as the first and second processing fluids, potentially at the same temperature, can have several processing advantages, including a simple processing fluid circulation system(s) and recycling of the processing fluids. Further, when the temperature of the first processing fluid is the same as the second processing fluid, or approximately the same, it is ensured that the entire upper surface of the substrate is properly equilibrated at the correct temperature before the second processing fluid is applied to the upper surface of the substrate.

In one non-limiting example, the upper surface of the substrate can contain a SiN film to be etched by the second processing fluid, and the first and second processing fluids can contain phosphoric acid applied at a temperature greater than 100° C., for example 165° C. or greater. In other examples, the temperature can be greater than 110° C., greater than 120° C., greater than 130° C., greater than 14° C., greater than 150° C., or greater than 160° C. In still other examples, the temperature can between greater than 100° C. and 200° C., between 130° C. and 200° C., or between 15° C. and 18° C.

In addition to etching a SiN film from the upper surface of the substrate, it may be desirable to also etch a SiN film from the lower surface of the substrate. In one example, once the substrate has been pre-heated by applying the first processing fluid (e.g., hot phosphoric acid) to the lower surface of the substrate, the application of first processing fluid may be continued when the application of the second processing fluid (e.g., hot phosphoric acid) to the upper surface of the substrate is performed. Thus, etching of SiN films from both the upper and lower surfaces of the substrates may easily be achieved with good etch uniformity across the entire upper surface of the substrate. Further, the same reclaim system can be used for the first and second processing fluids.

Hot sulfuric acid is commonly used for treating semiconductor substrates. However, in some cases, hot phosphoric acid may be used to treat both the upper and lower surfaces of the substrates. The use of hot phosphoric acid can remove the need for using hot sulfuric acid and thereby eliminate presence of sulfuric acid fumes in the process chamber of the single substrate tool. This prevents exposure of sulfuric acid fumes to any materials on the upper surface of the substrate that may be sensitive to sulfuric acid. In addition, the use of sulfuric acid can result in residue of haze on the surfaces of the substrate. Further, no sulfuric acid processing fluid circulation system(s) and sulfuric recycling is needed.

In another embodiment, the first processing fluid applied to the lower surface of the substrate may contain sulfuric acid and the second processing fluid applied to the upper surface of the substrate may contain phosphoric acid. In one example, the first processing fluid is applied at a first temperature and the second processing fluid is applied at a second temperature that is lower than the first temperature. The higher boiling point of sulfuric acid allows sulfuric acid to be heated to a higher temperature than phosphoric acid. This allows for faster heating of the substrate and heating of the substrate to a higher temperature than can be achieved using a first processing fluid containing phosphoric acid. Sulfuric acid is less costly than phosphoric acid, and this can reduce the need for reclaiming/recycling the sulfuric acid. In another example, the first processing fluid applied to the lower surface of the substrate may contain sulfuric acid and the second processing fluid applied to the upper surface of the substrate may contain a mixture of phosphoric acid and sulfuric acid.

What is claimed is:

1. A method for processing a substrate having a nitride film on the upper surface of the substrate in single substrate tool, the method comprising:

providing the substrate having a nitride film on the upper surface of the substrate in the single substrate tool;

applying a first processing fluid at a first temperature greater than 100° C. to a lower surface of the substrate to heat the substrate to approximately the first temperature, wherein the first processing fluid comprises phosphoric acid, sulfuric acid, or a mixture thereof; and applying a second processing fluid at a second temperature greater than 100° C. to an upper surface of the substrate to etch the nitride film on the upper surface of the substrate, wherein the second processing fluid comprises phosphoric acid, sulfuric acid, or a mixture thereof.

2. The method of claim 1, wherein applying the first processing fluid is performed before applying the second processing fluid.

3. The method of claim 1, wherein applying the first processing fluid overlaps in time with applying the second processing fluid.

4. The method of claim 1, wherein applying the second processing fluid etches a silicon nitride film on the upper surface of the substrate.

5. The method of claim 1, wherein the chemical composition of the first and second processing fluids are the same.

6. The method of claim 1, wherein the first and second processing fluids contains only one acid, which acid is phosphoric acid.

7. The method of claim 1, wherein the first and second temperatures are greater than 130° C.

8. The method of claim 1, wherein the first and second temperatures are greater than 160° C.

9. The method of claim 1, wherein the first temperature is greater than the second temperature.

10. The method of claim 1, wherein the first processing fluid comprises sulfuric acid and the second processing fluid comprises phosphoric acid, and wherein the first temperature is greater than the second temperature.

11. A method for processing a substrate in single substrate tool, the method comprising:
providing the substrate in the single substrate tool;
applying a first processing fluid containing only one acid, which acid is phosphoric acid at a first temperature greater than 100° C. to a lower surface of the substrate to heat the substrate to approximately the first temperature; and
applying a second processing fluid containing only one acid, which acid is phosphoric acid at a second temperature greater than 100° C. to an upper surface of the substrate, wherein applying the second processing fluid etches a silicon nitride film on the upper surface of the substrate.

12. The method of claim 11, wherein applying the first processing fluid is performed before applying the second processing fluid.

13. The method of claim 11, wherein applying the first processing fluid overlaps in time with applying the second processing fluid.

14. The method of claim 11, wherein the first and second temperatures are greater than 130° C.

15. The method of claim 11, wherein the first and second temperatures are greater than 160° C.

16. The method of claim 1, wherein the substrate has a nitride film on the lower surface of the substrate, and the first processing fluid etches the nitride film on the lower surface of the substrate.

17. The method of claim 1, wherein the first processing fluid and the second processing fluid are both free of sulfuric acid.

18. The method of claim 10, wherein the first processing fluid contains only one acid, which acid is sulfuric acid and the second processing fluid contains a mixture of phosphoric acid and sulfuric acid, and wherein the first temperature is greater than the second temperature.

19. The method of claim 10, wherein the first processing fluid contains only one acid, which acid is sulfuric acid and the second processing fluid contains only one acid, which acid is phosphoric acid, and wherein the first temperature is greater than the second temperature.

* * * * *

UNITED STATES PATENT AND TRADEMARK OFFICE
CERTIFICATE OF CORRECTION

PATENT NO. : 9,490,138 B2  
APPLICATION NO. : 14/565542  
DATED : November 8, 2016  
INVENTOR(S) : Kevin L. Siefering Page 1 of 1

It is certified that error appears in the above-identified patent and that said Letters Patent is hereby corrected as shown below:

Column 1
Line 56 "on the substrate (e.g., SiGe), but the use of hot water but" should be -- on the substrate (e.g., SiGe), but the use of hot water --

Column 3
Line 16 "than 16020 C. The substrate 106 is supported by substrate" should be -- than 160° C. The substrate 106 is supported by substrate --

Column 4
Line 5 "greater than 120° C., greater than 130° C., greater than 14°" should be -- greater than 120° C., greater than 130° C., greater than 140° --

Column 4
Line 8 "and 200° C., between 130° C. and 200° C., or between 15°" should be -- and 200° C., between 130° C. and 200° C., or between 150° --

Column 4
Line 10 "C. and 18° C." should be -- C. and 180° C. --

Signed and Sealed this  
First Day of May, 2018

Andrei Iancu  
*Director of the United States Patent and Trademark Office*